(12) United States Patent
Weinmann et al.

(10) Patent No.: US 7,285,930 B2
(45) Date of Patent: Oct. 23, 2007

(54) METHOD AND DEVICE FOR CONTROLLING A MULTIPHASE ELECTRONICALLY COMMUTATED MOTOR

(75) Inventors: Martin Weinmann, Bad Waldsee (DE); Alexander Müller, Bad Waldsee-Reute (DE); Stefan Zeh, Wangen (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 50 days.

(21) Appl. No.: 11/359,702

(22) Filed: Feb. 22, 2006

(65) Prior Publication Data

US 2007/0194734 A1 Aug. 23, 2007

(51) Int. Cl.
*H02P 5/00* (2006.01)

(52) U.S. Cl. ............... 318/439; 318/254; 318/138; 318/700; 318/672; 318/677; 318/678; 316/242; 316/236; 388/800; 323/282; 363/127

(58) Field of Classification Search ............. 318/254, 318/138, 439, 700; 388/800; 361/242; 323/282, 323/127
See application file for complete search history.

(56) References Cited

U.S. PATENT DOCUMENTS

| | | | | |
|---|---|---|---|---|
| 4,319,170 A | * | 3/1982 | Brent | 318/376 |
| 4,647,824 A | * | 3/1987 | Eichenwald | 318/71 |
| 4,859,916 A | * | 8/1989 | McCambridge | 318/293 |
| 5,291,106 A | * | 3/1994 | Murty et al. | 318/375 |
| 6,054,819 A | * | 4/2000 | Pengov | 318/254 |
| 6,121,736 A | | 9/2000 | Narazaki et al. | |
| 6,137,256 A | * | 10/2000 | Morris | 318/701 |
| 6,208,112 B1 | | 3/2001 | Jensen et al. | |
| 6,249,094 B1 | | 6/2001 | Zeh et al. | |
| 6,775,468 B2 | * | 8/2004 | Zinke et al. | 388/800 |
| 2005/0077884 A1 | * | 4/2005 | Krug et al. | 323/282 |

FOREIGN PATENT DOCUMENTS

| | | |
|---|---|---|
| DE | 198 46 831 A1 | 4/2000 |
| DE | 199 35 048 A1 | 2/2001 |

* cited by examiner

*Primary Examiner*—Rita Leykin
(74) *Attorney, Agent, or Firm*—Laurence A. Greenberg; Werner H. Stemer; Ralph E. Locher

(57) ABSTRACT

A method is specified for controlling a multiphase motor that is commutated by an inverter-side bridge circuit, in the course of which a particularly precise and technically simple detection of a control-relevant variable of a considered motor phase, in particular of a motor phase current and/or a back EMF voltage and/or a variable derived therefrom, takes place. It is provided here to determine the control-relevant variable with the aid of the current state of a freewheeling diode that is disposed in a phase half bridge, assigned to the respective motor phase, of the bridge circuit, the current state being detected during an on time in which a power switch, connected in parallel with the freewheeling diode, of the phase half bridge exhibits a conducting state, and a power switch connected in series with the freewheeling diode exhibits a blocking state.

15 Claims, 7 Drawing Sheets

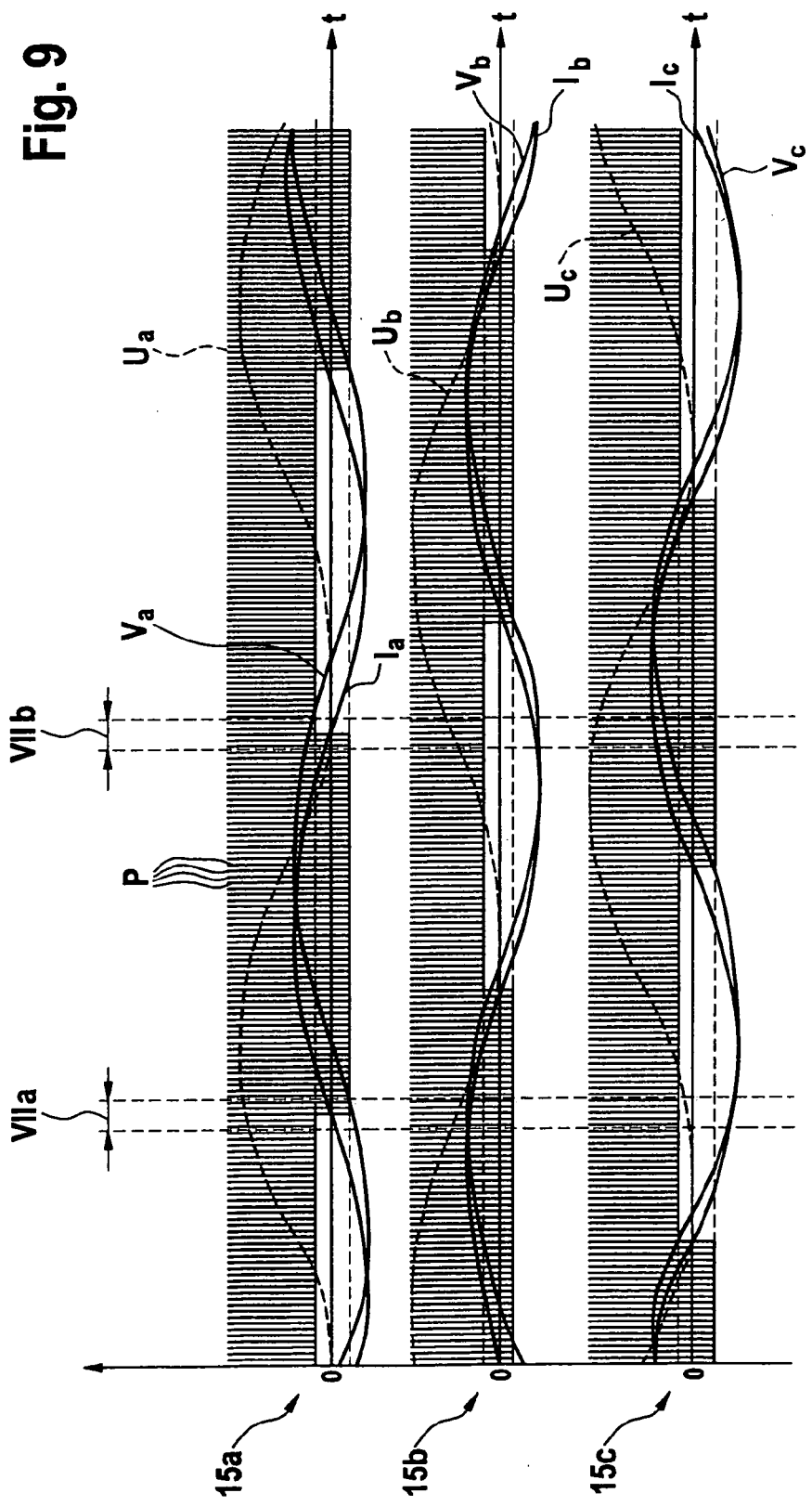

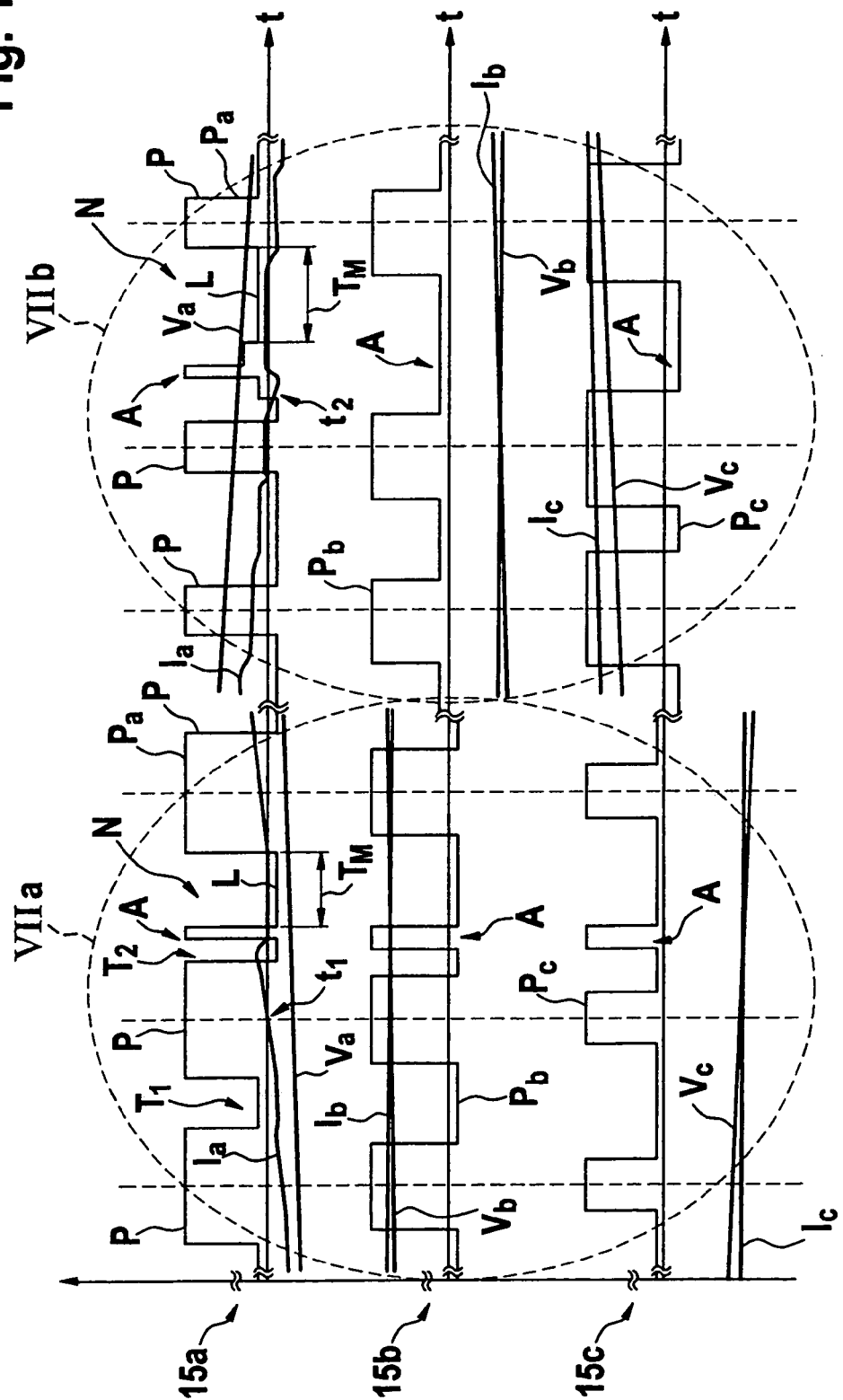

METHOD AND DEVICE FOR CONTROLLING A MULTIPHASE ELECTRONICALLY COMMUTATED MOTOR

BACKGROUND OF THE INVENTION

Field of the Invention

The invention relates to a method for controlling a multiphase, electronically commutated motor. The invention also relates to a device for carrying out the method.

An inverter that is usually implemented in the form of a bridge circuit is provided in an electronically commutated (electric) motor for the purpose of commutation, that is to say for driving the motor phases. Such a bridge circuit contains a number of phase half bridges that corresponds to the number of the motor phases, each phase half bridge being connected via a voltage intermediate circuit to the positive pole and the negative pole of a DC voltage source, and containing at a center tap a phase terminal for connecting an assigned motor phase. Within each phase half bridge, a power switch on the high-potential side is disposed between the phase terminal and the positive pole, and a power switch on the low-potential side is disposed between the phase terminal and the negative pole, and it is possible via them to block or enable the respective arm of the phase half bridge. Connected in parallel with each power switch is a freewheeling diode that is disposed in a blocking fashion in the direction of the potential drop between the positive pole and negative pole.

The commutation excites oscillating electric currents in the motor phases. The motor phase currents act to generate in the motor a rotating magnetic field that drives a rotor in the motor to execute a rotary movement. The motor is usually controlled with the aid of the motor phase currents and/or so-called back EMF voltages that are induced in each motor phase by the rotation of the rotor.

U.S. Pat. No. 6,121,736 discloses a control method for an electric motor of the above named type in the case of which the change in the flow direction of a motor phase current (denoted below as zero crossing of the motor phase current) is detected by detecting a terminal voltage assigned to the respective motor phase during a dead time of the power switch in the associated phase half bridge. The zero crossing of the motor phase current is recognized in this case from a change in the terminal voltage between a ground potential assigned to the negative pole and an operating potential assigned to the positive pole. The dead time is a changeover time provided in the course of a commutation switching process during which the two power switches of a phase half bridge are driven briefly in a blocking fashion in order to avoid a short circuit between the positive pole and the negative pole during quasi-simultaneous switching of the power switches (e.g. circuit breaker).

A disadvantage of the known method resides in that only the comparatively short dead time is available for detecting the motor current direction. Measurement of the terminal voltage with an acceptable outlay on circuitry is possible only when the dead time is of sufficiently long dimension. This requirement runs counter to the advancing development of modern motor controllers. The commercial availability of increasingly more precise power switches is also being accompanied by increasingly shorter dead times in order to eliminate the disturbing influence of harmonics in the motor phase currents caused by dead times.

In a further control method, disclosed in U.S. Pat. No. 6,208,112 B1, for a motor of the type, the phase shift between a motor phase current and the associated back EMF voltage is provided as a controlled variable. The phase shift is determined with the aid of the deviation between the zero crossing of the motor phase current and the zero crossing of the back EMF voltage. The measurement of the back EMF voltage is performed in this case in a motor phase that is separated from the supply network during the measurement.

SUMMARY OF THE INVENTION

It is accordingly an object of the invention to provide a method and a device for controlling a multiphase, electronically commutated motor which overcomes the above-mentioned disadvantages of the prior art methods and devices of this general type, in the course of which a particularly precise and technically simple detection of a control-relevant variable, in particular a motor phase current and/or a back EMF voltage and/or a variable derived therefrom takes place. It is also the object of the invention to specify a device that is particularly suitable for carrying out the method.

It is provided thereby that a control-relevant variable associated with a motor phase is determined by detecting the current state of a freewheeling diode that is disposed within a phase half bridge, associated with the motor phase, of a bridge circuit. The current state is detected here during a time period, denoted hereinafter as "on time", that is defined by virtue of the fact that a first power switch, connected in parallel with the freewheeling diode, within the phase half bridge is switched "on", that is to say exhibits a conducting state, while a second power switch connected in series with the freewheeling diode exhibits a blocking state.

A distinction is made below between a "respective motor phase" and "further motor phases". This phraseology is intended to express that detecting the current state of a given freewheeling diode always determines a control-relevant variable which is associated with the respective motor phase in whose assigned phase half bridge the freewheeling diode is disposed. This motor phase is denoted below as "respective motor phase" to distinguish it from the "further motor phase". However, this phraseology is not to be understood in the sense of a fixation on a specific, physical motor phase. Rather, in the preferred embodiment, the current state of a freewheeling diode respectively detects every phase half bridge such that, depending on reference, any motor phase can be the "respective motor phase".

The current state of the freewheeling diode is detected in an expedient variant of the method by a direct current sensor, in particular a bipolar transistor that is connected in series via its base-emitter junction with the freewheeling diode. In an equally preferred alternative variant of the method, the current state of the freewheeling diode is determined indirectly with the aid of a reference voltage dropping across the freewheeling diode, for example by a comparator circuit. The indirect detection of the current state is particularly suitable for comparatively high drive powers, the more so as the indirect detection of the current state is substantially free of losses.

This reference voltage is known to correspond to the forward voltage (dropping in the conducting direction) of the freewheeling diode when the latter is energized. By contrast, if the freewheeling diode is deenergized, the reference voltage during the on time corresponds to the saturation voltage (dropping in the blocking direction of the freewheeling diode) of the parallel-connected power switch. Consequently, given a change in the current state of the freewheeling diode, the reference voltage changes sign, as a result of which the current state of the freewheeling diode and a change in the same can be recognized with the aid of measures that are particularly simple in terms of circuitry and therefore especially cost-effective.

The current state of the freewheeling diode on the low-potential side, that is to say disposed between a phase terminal and the negative pole, of a phase half bridge is preferably determined. This is expedient, in particular, with regard to the aspect that the negative pole is usually employed as system ground, to which it is customary also to refer the control logic of a motor drive. However, it is also possible in addition or as an alternative thereto to detect the current state of the freewheeling diode on the high-potential side.

In a preferred embodiment of the method, the flow direction of the motor phase current flowing in the respective or considered motor phase is determined as a control-relevant variable. It is known that a freewheeling diode disposed on the low-potential side is energized during the on time whenever the flow direction of the associated motor phase current is positive, that is to say when the motor current flows toward the motor. In the event of a negative flow direction of the motor phase current, by contrast, the freewheeling diode is not energized. The current state of a freewheeling diode on the high-potential side behaves here in exactly the opposite way.

It is preferred for the current state of the freewheeling diode to be monitored continuously, that is to say without a break during each on time, or in a time discrete fashion with a prescribed sampling rate, in order to recognize zero crossings, that is to say a change in flow direction of the motor phase current. It is particularly the instant at which the zero crossing takes place and, optionally, a sign assigned to the zero crossing that are recorded here as variables characteristic of a zero crossing. A zero crossing is recorded as positive here when the motor phase current changes from a negative flow direction to a positive flow direction. A change in flow direction from positive to negative is correspondingly denoted as a negative zero crossing.

Optionally derived variables such as the frequency of the motor phase current and/or the phase angle of the motor phase current at any desired instant are determined from the determined zero crossings of the motor phase current.

In addition or as an alternative to the flow direction of the motor phase current, in an advantageous embodiment of the method the sign of a back EMF voltage induced in the considered motor phase is determined as further control-relevant variable with the aid of the current state of the freewheeling diode. To this end, during an on time of a respective motor phase, in particular after off-commutation of the relevant motor phase current, a so-called zero vector state is produced in the course of which all the motor phases are clamped to a common pole of the voltage intermediate circuit such that there is applied to the further motor phases a terminal potential that substantially corresponds to the terminal potential of the respective or considered motor phase. Once the current state of the freewheeling diode on the low-potential side is determined, the zero vector state is implemented, in particular, by clamping all the motor phases to the negative pole.

During the zero vector state referred to the negative pole, in the limiting case of a low motor phase current the terminal potential assigned to the considered motor phase is positive by comparison with the ground potential whenever the associated back EMF voltage has a positive sign. The freewheeling diode on the low-potential side is correspondingly deenergized. Conversely, the freewheeling diode on the low-potential side is energized whenever the back EMF voltage has a negative side.

The sign of the back EMF voltage can also be determined in an equivalent way with the aid of the current state of a freewheeling diode on the high-potential side. Here, all the motor phases are clamped to the positive pole in order to produce the zero vector state. The freewheeling diode on the high-potential side is energized in the case of a positive sign of the back EMF voltage, and deenergized in the case of a negative sign of the back EMF voltage.

Both the flow direction of the motor phase current and the sign of the back EMF voltage in the respective motor phase are preferably determined as control-relevant variables. The determination of the sign of the back EMF voltage is advantageously always performed here whenever a zero crossing of the motor phase current has previously been recognized. This determination of the sign of the back EMF voltage in a quasi-simultaneous fashion with the zero crossing of the motor phase current simultaneously yields information relating to a qualitative phase shift between the motor phase current and the back EMF voltage, that is to say it can be ascertained whether the back EMF voltage is leading or lagging behind the motor current. In a further embodiment of the method that is advantageous particularly for a synchronous motor, the information relating to this qualitative phase shift is used as controlled variable for the purpose of matching the phase of the motor phase current to the back EMF voltage.

In order to eliminate the motor current flowing in the motor phase before the production of the zero vector state, an off-commutation state is expediently connected upstream of the zero vector state. During the off-commutation state, the phase half bridge associated with the respective motor phase is connected to a high impedance. In other words, both power switches of the phase half bridge are temporarily driven in a blocking fashion. At the same time, a terminal potential that counteracts the motor phase current in the respective motor phase is applied to the further motor phases. Thus, if the motor phase current in the respective motor phase flows in the positive flow direction, the operating potential is thus substantially applied to the further motor phases. Correspondingly, the further motor phases are connected to ground when the motor phase current flows in the negative flow direction in the considered motor phase at the start of the off-commutation state.

With reference to a device provided for carrying out the method described above, the device contains a bridge circuit for driving a multiphase electronically commutated motor. The bridge circuit contains relative to each motor phase an assigned phase half bridge in which there are disposed with reference to a phase terminal a first power switch disposed on the high-potential side and a second power switched disposed on the low-potential side. In this case, a freewheeling diode is connected in parallel with each power switch. The device further contains a control unit that is configured for driving the power switches of the bridge circuit.

According to the invention, here a freewheeling diode at least of one phase half bridge is assigned a sensor circuit that is configured so as to determine the current state of the freewheeling diode during an on time in accordance with the above definition. The sensor circuit feeds the control unit an output value that characterizes the current state and with the aid of which the control unit uses the method described above to determine a control-relevant variable, in particular the flow direction of the motor phase current, the sign of the back EMF voltage or a variable derived therefrom.

The sensor circuit is expediently associated with a freewheeling diode disposed on the low-potential side. A sensor circuit is preferably associated with the freewheeling diode, on the low-potential side, of each phase half bridge.

In order to measure the current state of the freewheeling diode directly, in a preferred embodiment of the invention the sensor circuit contains a bipolar transistor that is connected in series via its base-emitter junction to the freewheeling diode. In an alternative configuration of the invention, the sensor circuit contains for the purpose of indirectly measuring the current state a comparator that is fed an anode-side diode potential and a cathode-side diode potential of the freewheeling diode in order to detect the reference voltage dropping across the freewheeling diode.

In an embodiment of the invention that is particularly advantageous in terms of circuitry, the sensor circuit together with the associated freewheeling diode and the power switch connected in parallel with the latter, is integrated in a common subassembly, in particular one of monolithic configuration that is implemented as a 4 pole component, that is to say in addition to the three inputs of the power switch it contains a sensor output, which is assigned to the sensor circuit at which the output signal can be tapped. The sensor output is configured, in particular, as an open-collector output. Instead of an active voltage signal, an open-collector output provides a passive resistance value for characterizing a signal state.

The advantages associated with the invention relates, in particular, in that control-relevant variables such as the flow direction of a motor phase current and/or the sign of a back EMF voltage can be determined in a way that is particularly simple in terms of circuitry and therefore cost-effective by a common measurement principle, specifically detecting the current state of a freewheeling diode during the switching state characteristic of the above-defined on time. Such on times inherently occur in the case of a conventional motor drive and do so with a duration of sufficient length for measurement purposes, and so it is possible, in particular, to determine the flow direction of the motor phase current without any problem during normal operation of the motor. The above-described measurement principle is particularly advantageous with regard to detecting the back EMF voltage insofar as the measurement of the back EMF voltage is performed during a zero vector state. Such a zero vector state is typically traversed once with each clock cycle of the power switch.

The fact that the flow direction of the motor phase current and the sign of the back EMF voltage are detected with the aid of one and the same sensor circuit contributes in particular to simplifying the construction of the control device. Despite the simple design in terms of circuitry, this fact permits highly precise measurement such that, in particular, even the comparatively weak back EMF voltage, caused by the remanence magnetism of the rotor iron, of an asynchronous motor is reliably measured. The method and the associated device can likewise also be used advantageously in a synchronous motor, in particular for matching the phases of the motor phase currents to the back EMF voltage.

Other features which are considered as characteristic for the invention are set forth in the appended claims.

Although the invention is illustrated and described herein as embodied in a method and a device for controlling a multiphase, electronically commutated motor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 9 is a diagram showing the time profile of the motor phase currents, the terminal potentials and phase voltages in the case of a so-called "central modulation", and additionally the time profile of the back EMF voltage induced in each motor phase, in an illustration in accordance with FIG. 7; and FIG. 10 is a diagram showing time segments VIIa and VIIb of the diagram in accordance with FIG. 9 with refined time resolution in an illustration in accordance with FIG. 8.

DESCRIPTION OF THE PREFERRED EMBODIMENTS

Figure 1:
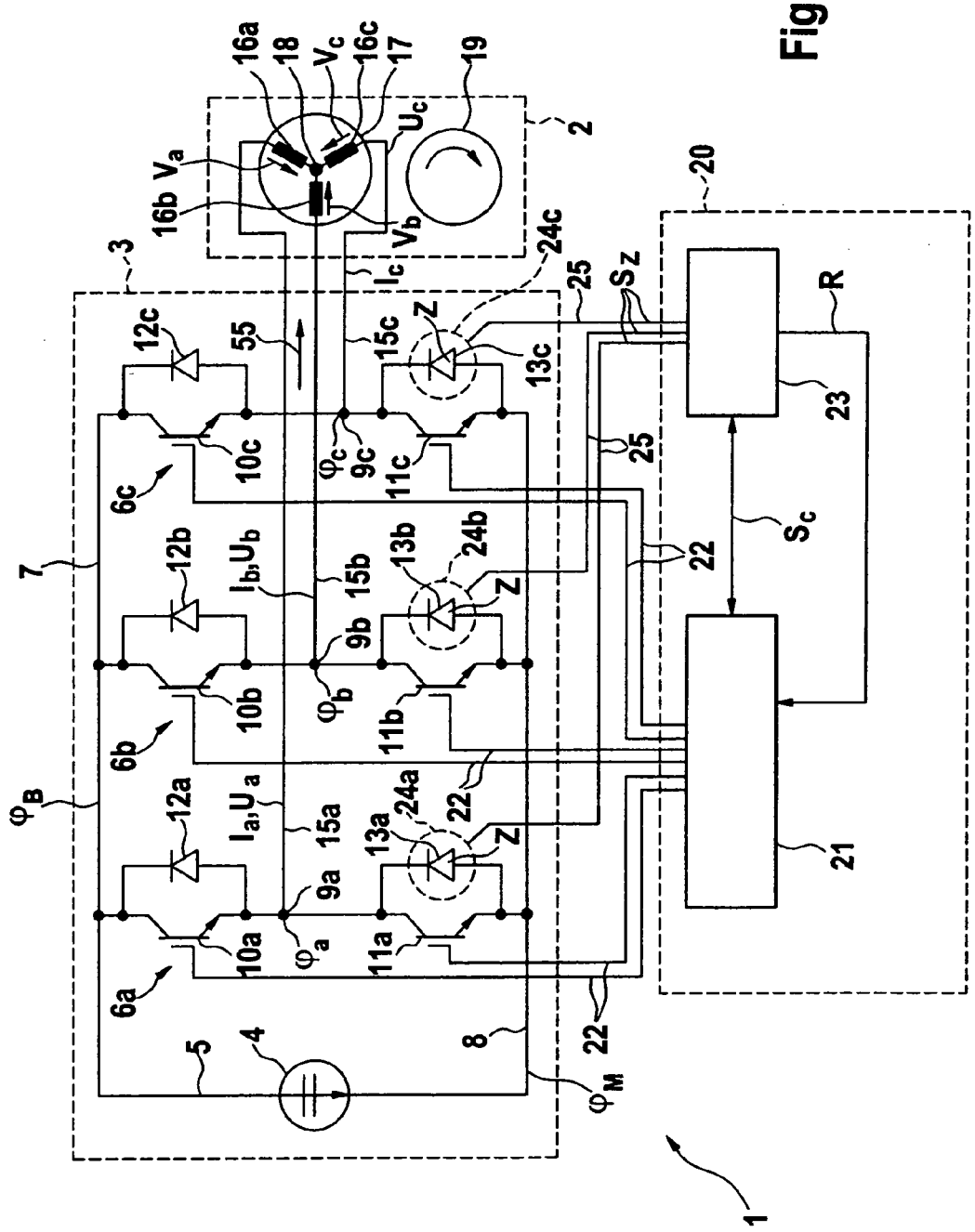
FIG. 1 is a simplified schematic circuit diagram of a device for driving a three-phase, electronically commutated motor, having an inverter-side bridge circuit and a control unit driving the latter according to the invention.

Components and elements which correspond to one another are denoted by the same designations throughout the figures. Referring now to the figures of the drawing in detail and first, particularly, to FIG. 1 thereof, there is shown a simplified schematic circuit diagram of a device 1 for controlling a three-phase, electronically commutated motor 2. The motor 2 is, for example, a brushless synchronous motor with a permanent magnet. The method described below and the associated device 1 can, however, also be used to control other motor types, in particular in the case of an asynchronous motor or a reluctant synchronous motor.

The device 1 contains an inverter-side bridge circuit 3 that is supplied with voltage by a DC voltage source 4 via a voltage intermediate circuit 5. The bridge circuit 3 contains three phase half bridges 6a, 6b, 6c that are connected in a parallel circuit in each case between a positive pole 7 and a negative pole 8 of the voltage intermediate circuit 5. Each phase half bridge 6a, 6b, 6c has a phase terminal 9a, 9b, 9c at a center tap. Within the respective phase half bridges 6a, 6b, 6c, a power switch 10a, 10b, 10c on a high-potential side is connected between the phase terminal 9a, 9b, 9c and the positive pole 7. Likewise, within the respective phase half bridges 6a, 6b, 6c a power switch 11a, 11b, 11c on a low-potential side is connected between the respective phase terminal 9a, 9b, 9c and the negative pole 8. The power switches 10a, 10b, 10c and 11a, 11b, 11c are configured as semiconductor switch elements, in particular IGBTs or MOSFETs. A freewheeling diode 12a, 12b, 12c on the high-potential side is connected in parallel with each power switch 10a, 10b, 10c on the high-potential side. Likewise, an associated freewheeling diode 13a, 13b, 13c on the low-potential side is connected in parallel with each power switch 11a, 11b, 11c on the low-potential side. With their conducting direction, the freewheeling diodes 12a, 12b, 12c and 13a, 13b, 13c are respectively aligned with the positive pole 7, and thus connected in the blocking direction with reference to the potential drop between the positive pole 7 and negative pole 8.

An associated motor phase 15a, 15b, 15c of the motor 2, which is configured here by way of example in a star connection makes contact with the phase terminal 9a, 9b, 9c of each phase half bridge 6a, 6b, 6c. Each motor phase 15a, 15b, 15c contains an exciter winding 16a, 16b, 16c that is disposed in a stator 17 of the motor 2. The motor phases 15a, 15b, 15c are connected together inside the stator 17 at a star point 18. The motor 2 further contains a rotor 19 that is rotatably supported inside the stator 17 and, in particular, contains a non-illustrated permanent magnet.

The device 1 also contains a control unit 20 that is configured, in particular, as a logic electric circuit. The control unit 20 contains a switching module 21 for controlling the opening and/or closing of the power switches 10a, 10b, 10c and 11a, 11b, 11c. For this purpose, the switching module 21 is connected via an appropriate control line 22 in each case to the gate input of each power switch 10a, 10b, 10c and 11a, 11b, 11c.

In order to determine a controlled variable R (described in more detail subsequently), the control unit 20 further contains an evaluation module 23. The evaluation module 23 is configured here for the purpose of determining the controlled variable R with the aid of the (deenergized or energized) current state Z, each freewheeling diode 13a, 13b, 13c on the low-potential side. For the purpose of detecting the current state Z, each of the freewheeling diodes 13a, 13b, 13c on the low-potential side is assigned a sensor circuit 24a, 24b, 24c that feeds an output signal $S_z$ specifying the current state Z to the evaluation module 23 via a respective detection line 25. The evaluation module 23 and the switching module 21 are connected for the purpose of exchanging control signals $S_c$.

Figure 2:
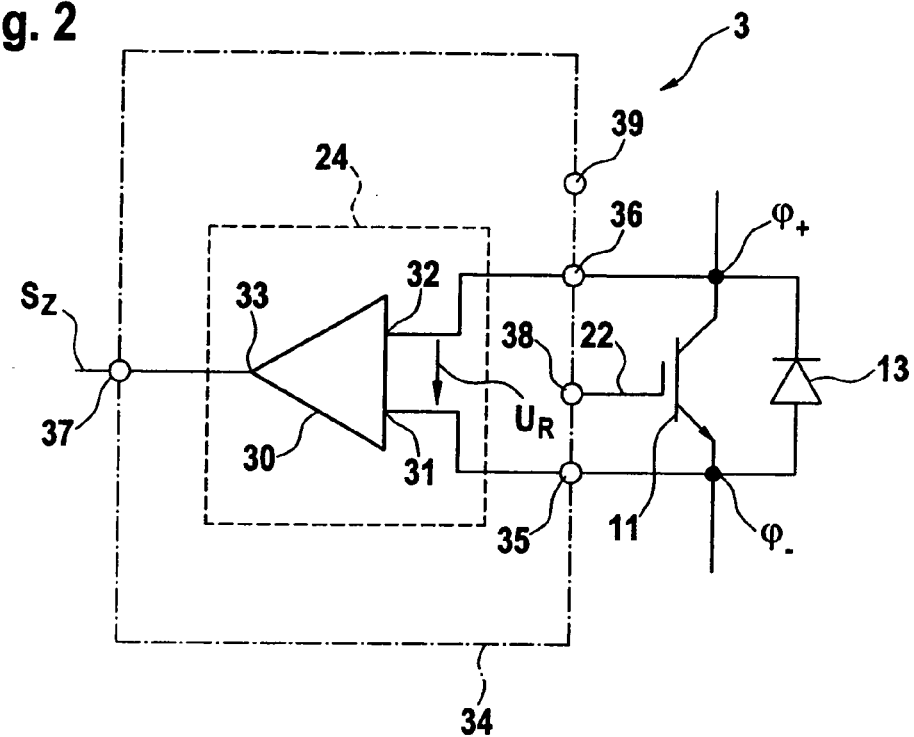
FIG. 2 is an electronic circuit diagram of a power switch and a parallel-connected freewheeling diode of the bridge circuit in accordance with FIG. 1, having a sensor circuit, configured as a comparator circuit, for detecting the current state of the freewheeling diode.
Figure 3:
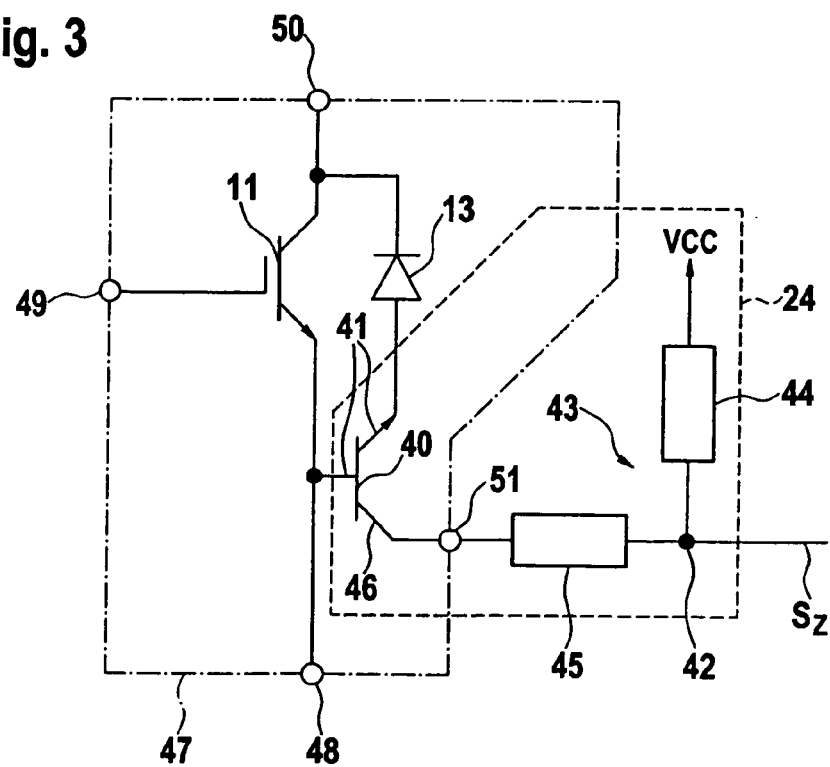
FIG. 3 is an electronic circuit diagram of an alternative configuration of the sensor circuit in an illustration in accordance with FIG. 2.

A power switch 11 on the low-potential side that stands by way of example for any desired power switch 11a, 11b, 11c in accordance with FIG. 1 is illustrated in an enlarged fashion in FIGS. 2 and 3 together with the parallel-connected freewheeling diode 13 (corresponding to one of the freewheeling diodes 13a, 13b, 13c from FIG. 1) and the sensor circuit 24 assigned thereto (corresponding to one of the sensor circuits 24a, 24b, 24c from FIG. 1). The sensor circuit 24 is constructed as a comparator circuit in a first configuration in accordance with FIG. 2. The sensor circuit 24 here contains a comparator 30 that is connected in parallel via its inputs 31 and 32 to the respective freewheeling diode 13 such that input 31 is assigned an anode-side diode potential $\phi_-$, and input 32 is assigned a cathode-side diode potential $\phi_+$. The comparator 30 compares the diode potentials $\phi_-$ and $\phi_+$ that are present and outputs at an output 33 the output signal $S_z$ in the form of a logic signal whose value is a function of the diode potentials $\phi_-$ and $\phi_+$, and thus of the sign of a reference voltage $U_R=(\phi_+-\phi_-)$ dropping across the freewheeling diode 13. The current state Z is determined here indirectly via the sign of the reference voltage $U_R$. If the freewheeling diode 13 is energized, the reference voltage $U_R$ corresponds to the flow direction of the freewheeling diode 13 that drops in the conductive direction and is therefore negative. If the freewheeling diode 13 is deenergized, the reference voltage $U_R$ dropping across it is positive.

The sensor circuit 24 is optionally integrated in a common driver block 34 together with the switching module 21. In this configuration, the diode potentials $\phi_-$ and $\phi_+$ are applied to a "COM" input 35 or to a "Vs" input 36 of the driver block 34 that make contact within the block with the inputs 31 and 32 of the comparator 30. The output signal $S_z$ can be tapped at a "sign" output 37 of the driver block 34 that is connected up to the output 33 of the comparator 30. An "LO" input 38 of the driver block 34 is connected to the gate input of the power switch 11 on the low-potential side via the associated control line 22. A "HO" input 39 of the driver block 34 is connected corresponding to the gate input of the associated power switch 10a, 10b, 10c on the high-potential side (not illustrated in FIG. 2). The inputs 38 and 39 are connected (in a way not illustrated in more detail) inside the block to the switching module 21.

In an alternative configuration of the sensor circuit 24 in accordance with FIG. 3, the current state Z of the freewheeling diode 13 is measured directly. To this end, the freewheeling diode 13 is connected in series with a bipolar transistor 40 via a base-emitter junction 41 thereof. The output signal $S_z$ can be tapped here at a center tap 42 of a voltage divider circuit 43 that is connected to a supply potential VCC via a resistor 44, and to a collector input 46 of the bipolar transistor 40 via a resistor 45. In terms of circuit engineering, the base-emitter junction 41 of the bipolar transistor 40 now by itself has the properties of a diode aligned in the same sense as the freewheeling diode 13. The bipolar transistor 40 can thereby also completely replace the freewheeling diode 13 given an appropriate configuration.

The power switch 11, the freewheeling diode 13 and the bipolar transistor 40 are optionally combined in a common electronic subassembly 47. The subassembly 47 is conceived as a 4-pole component. It contains three connections 48, 49 and 50 that are to be assigned to the power switch 11 and of which the connection 48 is provided for connection to the negative pole 8, the connection 49 is provided as control input for connection to the switching module 21, and the connection 50 is provided for connection to the respective motor phase terminal 9a, 9b, 9c. The subassembly 47 further contains a sensor output 51 that is connected to the collector input 46 of the bipolar transistor 40. In terms of circuitry, the sensor output 51 has the properties of an open-collector output and provides a resistance value that is a highly sensitive function of the current state of the base-emitter junction 41, and thus of the current state Z of the freewheeling diode 13. The subassembly 47 is preferably of monolithic configuration. The illustration of the bipolar transistor 40 does not in this case represent a separate part, but a characteristic of the subassembly 47 in terms of circuitry.

Figure 4:
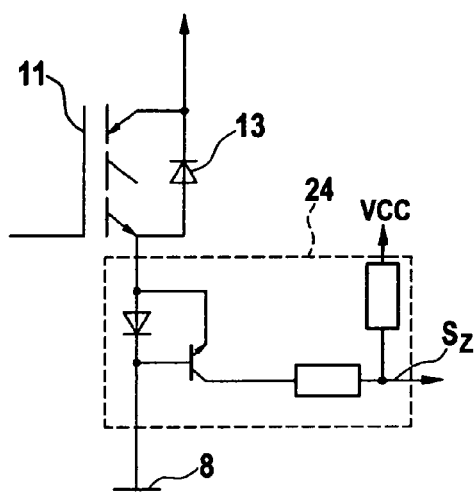
FIGS. 4 to 6 are schematic diagrams of the sensor circuit in an illustration in accordance with FIG. 2.
Figure 5:
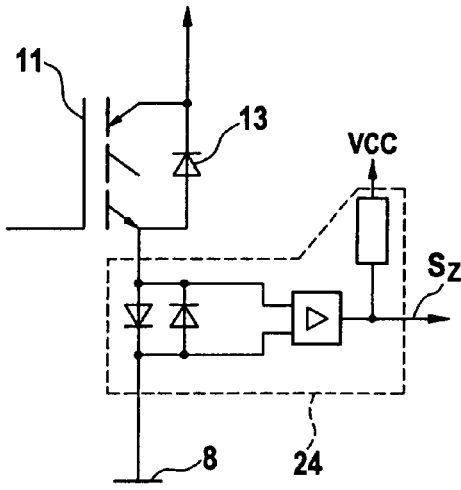
Figure 6:
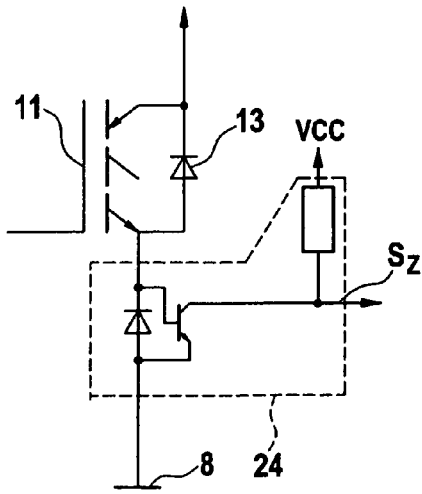

Further embodiments of the sensor circuit 24 are illustrated in FIGS. 4 to 6. By contrast with the embodiments in accordance with FIGS. 2 and 3 described above, the sensor circuit 24 is connected here in each case between the semiconductor component formed from the power switch 11 on the low-potential side and the assigned freewheeling diode 13 and the negative pole 8.

As the motor 2 operates, commutation of the motor phases 15a, 15b, 15c, that is to say periodically controlling the power switch 10a, 10b, 10c and 11a, 11b, 11c to close and open in each motor phase 15a, 15b, 15c produces a periodically fluctuating motor phase current $I_a$, $I_b$, $I_c$, the motor phase current $I_a$ being assigned to the motor phase 15a, the motor phase current $I_b$ being assigned to the motor phase 15b and the motor phase current $I_c$ being assigned to the motor phase 15c—as indicated in FIG. 1. The motor phase currents $I_a$, $I_b$, $I_c$ generate in the stator 17 of the motor 2 a rotating magnetic exciter field that drives the rotor 19. A motor phase current $I_a$, $I_b$, $I_c$ flowing to the motor 2 within a motor phase 15a, 15b, 15c is subsequently recorded with a positive sign. A positive motor phase current $I_a$, $I_b$, $I_c$ therefore flows along a flow direction 55 indicated in FIG. 1. A motor phase current $I_a$, $I_b$, $I_c$ flowing away from the motor 2 is correspondingly recorded with a negative sign. A corresponding motor phase current $I_a$, $I_b$, $I_c$ therefore flows in a direction opposite to the flow direction 55.

In order to control the phase currents $I_a$, $I_b$, $I_c$, a terminal potential $\phi_a$, $\phi_b$, $\phi_c$ is set at the respectively associated phase terminal 9a, 9b, 9c by controlling the power switches 10a, 10b, 10c and 11a, 11b, 11c to open and close.

The power switch 10a, 10b, 10c on the high-potential side and the associated power switch 11a, 11b, 11c on the low-potential side of each phase half bridge 6a, 6b, 6c are always driven here—if not explicitly stated otherwise—antiparallel such that in each case one power switch 10a, 10b, 10c or 11a, 11b, 11c exhibits a conducting state within each phase half bridge 6a, 6b, 6c, while the other power switch 10a, 10b, 10c or 11a, 11b, 11c exhibits a blocking state. If the power switch 10a, 10b, 10c, on the high-potential side of a phase half bridge 6a, 6b, 6c is conducting, the associated terminal potential $\phi_a$, $\phi_b$, $\phi_c$ substantially corresponds to an operating potential $\phi_B$ assigned to the positive pole 7. If, by contrast, the power switch 11a, 11b, 11c on the low-potential side is conducting, the associated terminal potential $\phi_a$, $\phi_b$, $\phi_c$ then corresponds approximately to a ground potential $\phi_M$ that can be tapped at the negative pole 8. A change in the switching state within a phase half bridge 6a, 6b, 6c generally takes place in a quasi-simultaneous fashion for both power switches 10a, 10b, 10c and 11a, 11b, 11c, more precisely within the dead time introduced at the beginning which, however, is negligible for the following discussion because of its short duration. The switching module 21 drives the motor phases $I_a$, $I_b$, $I_c$ by applying a pulse width modulation (PWM). In the process, the power switch 10a, 10b, 10c, on the high-potential side, of the motor phase 15a, 15b, 15c to be driven is driven by a series of control pulses P (FIG. 7) that follow one another with a prescribed clock frequency. The duration of each control pulse P, which is denoted as pulse width, is modulated in the course of the control method between 0% and 100% of the duration of a PWM clock signal. The power switch 10a, 10b, 10c on the high-potential side is switched off for the time period, following the control pulse P, of a PWM clock signal, and the associated motor phase 15a, 15b, 15c is clamped to the negative pole 8 by controlling the corresponding power switch 11a, 11b, 11c on the low-potential side to open. In the circuit configuration illustrated in FIG. 1, a time period characterized by this switching state corresponds to an on time in respect of the above definition.

The temporal mean value of the corresponding terminal potential $\phi_a$, $\phi_b$, $\phi_c$ that is formed over the PWM clock signal is subsequently denoted as phase voltage $U_a$, $U_b$, $U_c$. Each phase voltage $U_a$, $U_b$, $U_c$ is referred to the ground potential $\phi_M$ and varied between 0V and the operating potential $\phi_B$. The phase voltage $U_a$, $U_b$, $U_c$ is directly proportional here to the pulse width with which the corresponding motor phase 15a, 15b, 15c is driven.

Figure 7:
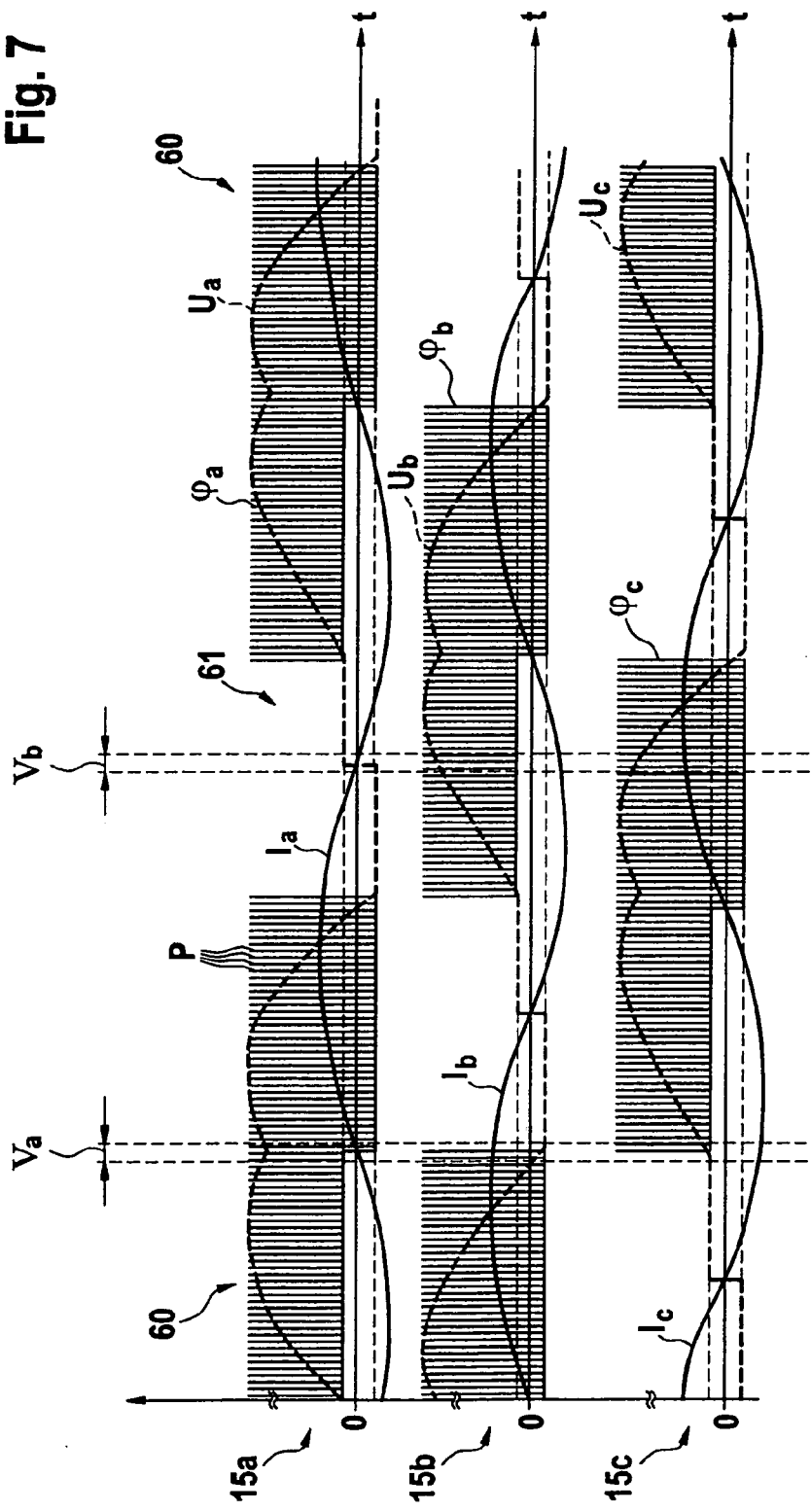
FIG. 7 is a diagram of a time profile of the motor phase current, the terminal potential and the phase voltage in the case of a so-called flat bottom modulation in a schematic for each of the three motor phases.

In practice, a number of variants of the pulse width modulated motor drive are used to which the method according to the invention can likewise be applied. A so-called flat bottom modulation is illustrated in FIG. 7 by way of example. The respective motor phase current $I_a$, $I_b$, $I_c$, the assigned terminal potential $\phi_a$, $\phi_b$, $\phi_c$ and the respective phase voltage $U_a$, $U_b$, $U_c$ are shown separately in FIG. 7 in a diagram in a fashion plotted against time t for each motor phase 15a, 15b, 15c.

It is first to be gathered from the diagram in accordance with FIG. 7 that the phase currents $I_a$, $I_b$, $I_c$ vary periodically in accordance with an at least substantially sinusoidal time dependence. The period of this sinusoidal time dependence corresponds to a complete rotation of the exciter field and also—in the case of a synchronous motor with N pole pairs—to a Nth rotation of the rotor 19. A time interval within the diagram is therefore directly proportional to a change in the phase angle of the exciter field or the rotor movement.

In the flat bottom modulation in accordance with FIG. 7, each motor phase 15a, 15b, 15c is driven with pulse width modulation during a first subcycle 60, corresponding to a phase angle range of 240°, of each period. The subcycle 60 is to be recognized in the illustration in accordance with FIG. 7 from the peaks, corresponding respectively to a control pulse P, of the terminal potentials $\phi_a$, $\phi_b$, $\phi_c$ that, because of the restricted time resolution, are indicated in FIG. 7 merely as vertical strokes in a manner neglecting their respective temporal extent. As is to be recognized from the corresponding profile of the respective phase voltage $U_a$, $U_b$, $U_c$, the pulse width, proportional thereto, of the control pulse P increases in the course of the first half of the subcycle 60, traverses two maxima and decreases again in the second half of the subcycle 60. Following the subcycle 60 is a second subcycle 61, which corresponds to a phase angle range of 120° and thereby completes the period, that is to say it is supplemented by the subcycle 60 to form a complete cycle corresponding to a phase angle range of 360°. During the subcycle 61, the respective motor phase 15a, 15b, 15c is clamped permanently to the ground potential $\phi_M$. During this subcycle 61, the phase voltage $U_a$, $U_b$, $U_c$ corresponds to the associated terminal potential $\phi_a$, $\phi_b$, $\phi_c$.

The behavior of the terminal potential $\phi_a$ in the event of a zero crossing of the associated motor phase current $I_a$ is explained in more detail below in the consideration restricted by way of example to the motor phase 15a. Denoted as positive zero crossing here is a zero crossing in the case of which the flow direction changes from negative to positive. Such a positive zero crossing occurs in accordance with FIG. 7 within the marked time segment Va. Denoted as negative zero crossing is a zero crossing of the motor phase current $I_a$ in the case of which the flow direction changes from positive to negative. Such a negative zero crossing occurs within the marked time segment Vb.

Figure 8:
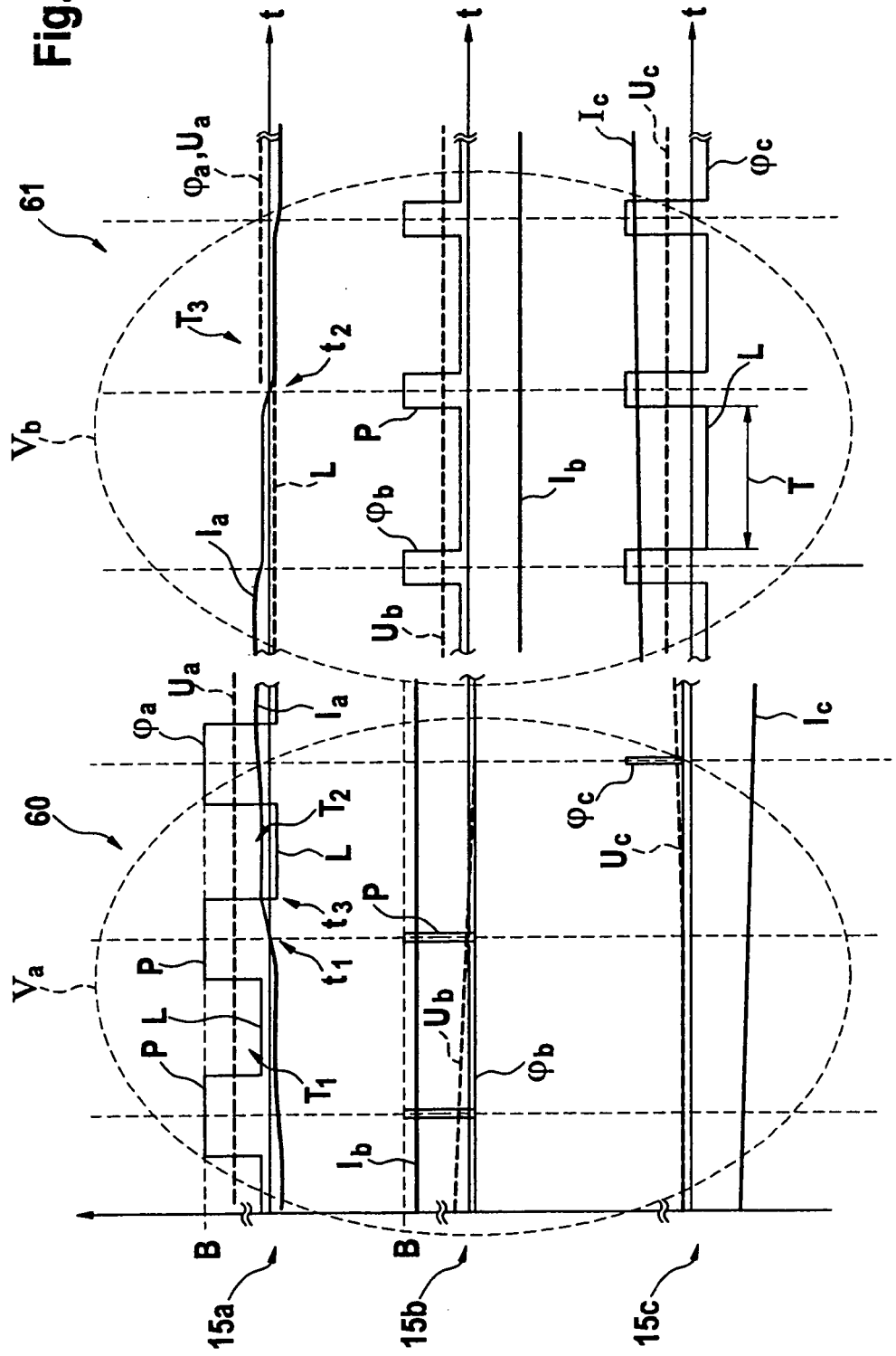
FIG. 8 is a diagram showing time segments Va and Vb of the diagram in accordance with FIG. 7 in a diagram with a time scale that is refined by comparison with FIG. 7.

The time segments Va and Vb are illustrated once more in FIG. 8, with a refined time resolution. It is to be gathered, in particular, from FIG. 8 that a base value L that the terminal potential $\phi_a$ respectively assumes during each on time T is determined by the flow direction or the sign of the associated motor phase current $I_a$. For the positive zero crossing taking place at the instant $t_1$ in accordance with FIG. 8, the base value L of the terminal potential $\phi_a$ is slightly positive before the zero crossing and slightly negative thereafter. In the case of the negative zero crossing taking place at an instant $t_2$ in accordance with FIG. 8, the terminal potential $\phi_a$ behaves oppositely, and thus exhibits a slightly negative value before the zero crossing and a slightly positive value after the zero crossing.

The base value L of the terminal potential $\phi_a$ is determined here by the current state Z of the freewheeling diode 13a. As a consequence of the continuity, that is to say the inductively induced "inertia" of the motor phase current $I_a$, the motor phase current $I_a$ flows off via the power switch 11a during the on time in the case of a negative flow direction. The motor phase current $I_a$ is directed here in the blocking direction of the freewheeling diode 13a, which is therefore deenergized. By contrast with the ground potential $\phi_M$, the terminal potential $\phi_a$ consequently has a positive value corresponding to the saturation voltage of the power switch 11a. In the case of a positive flow direction, by contrast, the current flow is directed in the conducting direction of the freewheeling diode 13a, which is therefore energized. The base value L of the terminal potential $\phi_a$ is consequently lowered in comparison with the ground potential $\phi_M$ by an amount corresponding to the forward voltage of the freewheeling diode 13a, and is therefore negative, in particular.

The current state Z of the freewheeling diode 13a, or the dependence which it causes of the base value L of the terminal potential $\phi_a$ is utilized according to the method in order to determine the flow direction and, in particular, zero crossings of the motor phase current $I_a$.

As is to be recognized in turn from FIG. 8, a positive zero crossing of the motor phase current $I_a$ always takes place during a control pulse P. The zero crossing is ascertained from the change in the base value L between an on time $T_1$ immediately preceding the zero crossing, and an on time $T_2$ following thereupon. The recognition of the zero crossing is therefore performed, in particular, at an instant $t_3$ characterizing the start of the on time $T_2$, and thus with a slight time shift by comparison with the exact instant $t_1$ of the zero crossing.

A negative zero crossing occurs, by contrast, during the subcycle 61 that, on the basis of the switching state associated therewith, constitutes over its entire length an on time $T_3$ in the sense of the above definition. The zero crossing is therefore recognized immediately at the instant $t_2$ with the accuracy prescribed by the sampling rate of the current state Z.

A further example of a pulse width modulated motor drive to which the method according to the invention can be applied is illustrated in FIG. 9 (in an illustration analogous to FIG. 7). What is involved here is a so-called "central modulation" in which each motor phase 15a, 15b, 15c is driven in a clock fashion over the complete cycle of the phase angle. As may be recognized with the aid of the respective phase voltage $U_a$, $U_b$, $U_c$, the pulse width of the control pulses P varies in each motor phase 15a, 15b, 15c, for example in accordance with a sinusoidal time dependence on the period of the motor phase currents $I_a$, $I_b$, $I_c$. In addition to the motor phase currents $I_a$, $I_b$, $I_c$, the phase voltages $U_a$, $U_b$, $U_c$ and the terminal potentials $\phi_a$, $\phi_b$, $\phi_c$, FIG. 9 plots the time profile of a back EMF voltage $V_a$, $V_b$, $V_c$ that is induced in each motor phase 15a, 15b, 15c by the back EMF force of the rotor 19. The back EMF voltages $V_a$, $V_b$, $V_c$ induced in the motor phases 15a, 15b, 15c are referred to the, if appropriate, virtual star point 18 as common reference potential. In the illustration in accordance with FIG. 9, the back EMF voltage $V_a$, $V_b$, $V_c$ lags slightly behind the respectively associated motor phase current $I_a$, $I_b$, $I_c$.

A variant of the method in accordance with which (as was again considered by way of example with the aid of the motor phase 15a) the sign of the back EMF voltage $V_a$, $V_b$, $V_c$ and, in particular, its qualitative (that is to say positive or negative) phase shift by comparison with the associated motor phase current $I_a$, $I_b$, $I_c$ is determined by detecting the current state Z of the freewheeling diode 13a, is explained in more detail below with the aid of FIGS. 9 and 10. Illustrated with a refined time resolution in FIG. 10 in a similar way to FIG. 8 are time segments VIIa and VIIb of the diagram in accordance with FIG. 9 that correspond to a positive or negative zero crossing of the motor phase current $I_a$ considered by way of example.

The back EMF voltage $V_a$, $V_b$, $V_c$ of a motor phase 15a, 15b, 15c can be measured as soon as the current flow driven by the inductance of the exciter windings 16a, 16b, 16c has decayed, and the residual current in a motor phase 15a, 15b, 15c in the case of short circuited phase terminals 9a, 9b, 9c is driven by the back EMF voltage $V_a$, $V_b$, $V_c$ of the considered motor phase 15a, 15b, 15c.

The sign of the back EMF voltage $V_a$ is determined by applying a so-called zero vector state N to the motor phases 15a, 15b, 15c during a measuring time $T_M$. To this end, by controlling the power switches 11a, 11b, 11c to open not only is the considered motor phase 15a clamped to the ground potential $\phi_M$, but so also are the further motor phases 15b and 15c. The freewheeling diode 13a is energized during the zero vector state N whenever the back EMF voltage $V_a$ is negative, and the terminal potential $\phi_a$ consequently drops below the ground potential $\phi_M$. If, by contrast, the back EMF voltage $V_a$ is positive, the freewheeling diode 13a is deenergized.

Consequently, during the measuring time $T_m$ switched in accordance with FIG. 10 within the time segment VIIa, a negative base value L is measured on the basis of the negative back EMF voltage $V_a$, or the energized current state Z of the freewheeling diode 13a is detected as an index for the negative sign of the back EMF voltage $V_a$.

By contrast therewith, during measuring time $T_M$ switched within the time segment VIIb a positive base value L of the terminal potential $\phi_a$ or the deenergized current state Z of the freewheeling diode 13a is detected as a characteristic of the positive sign of the back EMF voltage $V_a$.

The detection of the back EMF voltage $V_a$ is performed in each case during recognition of a zero crossing of the associated motor phase current $I_a$, and thus at an instant when the current flow in the considered motor phase 15a is inherently particularly slight. In order to eliminate the residual current, an off-commutation state A is provided in the motor phase 15a upstream of the application of the zero vector state N. In the course of the off-commutation state A, the phase half bridge 6a is connected to high impedance by shading over the two power switches 10a and 11a. The terminal potentials $\phi_b$ and $\phi_c$ of the further motor phases 15b and 15c are simultaneously set to a value that counteracts the current flow in the considered motor phase 15a.

Immediately after recognition of the positive zero crossing of the motor phase current $I_a$ that takes place within the time segment VIIa, the further motor phases 15b, 15c are correspondingly clamped to the operating potential $\phi_B$. The successful off-commutation of the motor phase $I_a$ is to be recognized in this case from the fact that the freewheeling diode 13a becomes deenergized, and the terminal potential $\phi_a$ correspondingly grows from a negative value to a value corresponding approximately to the operating potential $\phi_B$.

By contrast, the further motor phases 15b and 15c are clamped to the ground potential $\phi_M$ in the course of the off-commutation state A immediately after recognition of the negative zero crossing of the motor phase current $I_a$ that takes place during the time segment VIIb. In this case, the off-commutation process is seen in that immediately with the blocking of the two power switches 10a and 11a of the phase half bridge 6a the terminal potential $\phi_a$ rises abruptly to a value substantially corresponding to the operating potential $\phi_B$, and falls back to a low value together with the exhaustion of the motor phase current $I_a$. In this case, the recognition of the current state Z for determining the back EMF voltage $V_a$ can begin as early as during the off-commutation state A as soon as the motor phase current $I_a$ has dropped.

The method according to the invention can be applied correspondingly to further common types of a pulse width modulated motor drive, in particular to a so-called block commutation. Furthermore, the back EMF voltages $V_a$, $V_b$, $V_c$, are also optionally determined qualitatively, for example using a method known per se from U.S. Pat. No. 6,249,094.

As the motor 2 is being operated, the evaluation unit 23 detects the current state Z, determined by the corresponding sensor circuit 24a, 24b, 24c, of the corresponding freewheeling diode 13a, 13b, 13c, doing so during each on time T of each phase half bridge 6a, 6b, 6c. The current state Z is detected at least once per on time T. Here, the evaluation unit 23 is appropriately "triggered" by the switching module 21 via the control signal $S_c$. If the evaluation module 23 recognizes a zero crossing of a phase current $I_a$, $I_b$, $I_c$ by using the procedure described in conjunction with FIGS. 7 and 8, it then determines the sign of the back EMF voltage $V_a$, $V_b$, $V_c$ using the procedure described in conjunction with FIGS. 9 and 10. To this end, by outputting appropriate control signals $S_c$ the evaluation module 23 prompts the switching module 21 to generate the off-commutation state A or to generate the zero vector state N.

The evaluation module 23 determines the controlled variable R with the aid of the flow direction or the sign of the motor phase currents $I_a$, $I_b$, $I_c$ and/or back EMF voltages $V_a$, $V_b$, $V_c$ as well as, if appropriate, with the aid of zero crossings of these variables derived therefrom, and transmits the controlled variable to the switching module 21.

The controlled variable R is, in particular, the instants that are assigned to a zero crossing of the phase currents $I_a$, $I_b$, $I_c$ and/or the back EMF voltages $V_a$, $V_b$, $V_c$ and are fed to the switching module 21 in the form of a trigger signal. Alternatively, the controlled variable R is a variable derived therefrom, in particular the speed or a qualitative or quantitative measure of the phase shift between a motor phase current $I_a$, $I_b$, $I_c$ and the assigned back EMF voltage $V_a$, $V_b$, $V_c$. The speed is determined here by determining the time interval between consecutive zero crossings. The sign of the back EMF voltage $V_a$, $V_b$, $V_c$ at the instant of a zero crossing of the associated motor phase current $I_a$, $I_b$, $I_c$ is transmitted as qualitative measure of the phase shift.

The switching module 21 drives the bridge circuit 3 in such a way, in particular, that the actual speed fed as controlled variable R is matched to a prescribed speed. Additionally or as alternative, the driving is optionally performed in such a way that the actual phase shift adopted as further controlled variable R is minimized in absolute terms between the motor currents $I_a$, $I_b$, $I_c$ and the associated back EMF voltages $V_a$, $V_b$, $V_c$.

Concrete exemplary embodiments of control algorithms of this type are known per se and are described, for example, in U.S. Pat. No. 6,249,094 B1, U.S. Pat. No. 6,208,112 B1 and U.S. Pat. No. 6,121,736 A.

A specific possibility for application of the method described relates in reliably recognizing the speed of a permanent magnet synchronous motor or of an asynchronous motor during stopping or in some other undriven freewheeling phase. During such freewheeling, one or more of the power switches 11a, 11b, 11c are controlled to be permanently open. In this case, under the action of the back EMF, the short circuited motor phases 15a, 15b, 15c generate circular currents by which a braking torque is exerted on the rotor 19. Even in the case of an asynchronous motor, because of the remanence magnetism a back EMF exists in the rotor iron, although it is substantially weaker by comparison with a permanent magnet synchronous motor. Especially as the current state Z constitutes a very sensitive measure of the voltage conditions present at the freewheeling diodes 13a, 13b, 13c, it is also possible for the very weak back EMF of an asynchronous motor to be reliably measured. If necessary, the remanence magnetism of the rotor iron is refreshed here by a stator pulse preceding the freewheeling phase in order to amplify the amplitude of the back EMF voltages $V_a$, $V_b$, $V_c$. It is possible in this way, particularly during stopping, to monitor the speed of the motor 2 virtually down to standstill. This functionality is useful for the purpose of recognizing the reliable standstill of the motor 2.

We claim:

1. A method for controlling a motor being commutated by an inverter-side bridge circuit and having a number of motor phases, which comprises the steps of:

determining a control-relevant variable of a respective motor phase by detecting a current state of a freewheeling diode disposed in a phase half bridge, associated with the respective motor phase, of the inverter-side bridge circuit, during an on time in which a first power switch, connected in parallel with the freewheeling diode, of the phase half bridge exhibits a conducting state, and a second power switch connected in series with the freewheeling diode exhibits a blocking state.

2. The method according to claim 1, which further comprises determining the current state of the freewheeling diode with an aid of a reference voltage dropping across the freewheeling diode.

3. The method according to claim 1, which further comprises disposing, the freewheeling diode whose current state is being determined, on a low-potential side with reference to a phase terminal within the phase half bridge associated with the respective motor phase.

4. The method according to claim 1, which further comprises determining a flow direction of a motor phase current flowing in the respective motor phase as the control-relevant variable with an aid of the current state.

5. The method according to claim 4, which further comprises monitoring the current state of the freewheeling diode continuously to determine zero crossings of the motor phase current, a zero crossing being recognized from a change in the current state.

6. The method according to claim 1, which further comprises determining a sign of a back EMF voltage induced by the motor in the respective motor phase as the control-relevant variable with an aid of the current state, this being done by producing a zero vector state with reference to a terminal potential applied to the respective motor phase, and with reference to further terminal potentials respectively applied to one of the further motor phases.

7. The method according to claim 6, which further comprises performing the determination of the sign of the back EMF voltage upon recognition of a zero crossing of a motor phase current in the respective motor phase.

8. The method according to claim 7, which further comprises:

before a production of the zero vector state, for the purpose of an off-commutation of the motor phase current in the respective motor phase, bringing an off-commutation state about in which the phase half bridge associated with the respective motor phase is connected to a high impedance; and applying a terminal potential counteracting the motor phase current in the respective motor phase to the further motor phases.

9. The method according to claim 7, which further comprises determining a phase shift between the motor phase current and the back EMF voltage as a controlled variable with an aid of a change in a flow direction of the motor phase current and of the sign of the back EMF voltage at this instant.

10. A device for driving a multiphase, electronically commutated motor, the device comprising:

an inverter-side bridge circuit having phase half bridges each associated with a motor phase, said phase half bridges each containing a phase terminal, a first power switch disposed on a high-potential side with reference to said phase terminal, a second power switch disposed on a low-potential side with reference to said phase terminal, and freewheeling diodes each connected in parallel with one of said first and second power switches, said inverter-side bridge circuit further containing a sensor circuit, one of said freewheeling diodes of at least one of said phase half bridges is connected to said sensor circuit configured to determine a current state of said respective freewheeling diode for detecting a control-relevant variable of a respective motor phase during an on time in which said second power switch connected in parallel with said respective freewheeling diode exhibits a conducting state, and said first power switch connected in series with said respective freewheeling diode exhibits a blocking state; and a control unit for driving said first and second power switches of said inverter-side bridge circuit.

11. The device according to claim 10, wherein said sensor circuit is disposed on said low-potential side with reference to said respective phase terminal.

12. The device according to claim 10, wherein said sensor circuit has a comparator receiving as an input potential an anode-side diode potential and a cathode-side diode potential of said freewheeling diode.

13. The device according to claim 10, wherein said sensor circuit contains a bipolar transistor having a base-emitter junction and connected in series through said base-emitter junction to said respective freewheeling diode.

14. The device according to claim 10, further comprising a common assembly, said sensor circuit, together with said respective freewheeling diode and said second power switch connected in parallel therewith, is integrated in said common subassembly.

15. The device according to claim 14, wherein said sensor circuit has a sensor output making available an output signal characterizing the current state of said respective freewheeling diode of said common subassembly, said sensor output having properties of an open-collector output.

* * * * *